(12) United States Patent
Song et al.

(10) Patent No.: US 11,135,804 B2
(45) Date of Patent: Oct. 5, 2021

(54) FILM FOR DISPLAY DEVICE AND DISPLAY DEVICE INCLUDING THE SAME

(71) Applicant: Samsung Display Co., Ltd., Yongin-si (KR)

(72) Inventors: Ju Hee Song, Anyang-si (KR); Seung-Hwa Ha, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 35 days.

(21) Appl. No.: 16/248,655

(22) Filed: Jan. 15, 2019

(65) Prior Publication Data

US 2019/0248102 A1  Aug. 15, 2019

(30) Foreign Application Priority Data

Feb. 9, 2018  (KR) .................. 10-2018-0016463

(51) Int. Cl.
*B32B 3/30* (2006.01)
*G02F 1/1333* (2006.01)
*H01L 27/32* (2006.01)
*G06F 1/16* (2006.01)
*H01L 27/12* (2006.01)

(52) U.S. Cl.
CPC .......... *B32B 3/30* (2013.01); *G02F 1/133305* (2013.01); *G06F 1/1652* (2013.01); *H01L 27/1218* (2013.01); *H01L 27/3244* (2013.01); *B32B 2457/20* (2013.01)

(58) Field of Classification Search
CPC ....... B32B 3/30; B32B 2457/20; G09F 9/301; G06F 1/1652
See application file for complete search history.

(56) References Cited

U.S. PATENT DOCUMENTS

| 9,274,559 | B2 | 3/2016 | Prushinskiy et al. |
| 2008/0284971 | A1 | 11/2008 | Park et al. |
| 2014/0029212 | A1* | 1/2014 | Hwang ................... G09F 9/301 361/749 |
| 2014/0140036 | A1* | 5/2014 | Kim ........................ G06F 3/041 362/19 |
| 2015/0036299 | A1 | 2/2015 | Namkung et al. |

(Continued)

FOREIGN PATENT DOCUMENTS

| JP | 2002-110349 A | 4/2002 |
| KR | 10-2013-0076402 A | 7/2013 |

(Continued)

OTHER PUBLICATIONS

EPO Extended Search Report dated Jun. 24, 2019, for corresponding European Patent Application No. 19155899.8 (8 pages).

(Continued)

*Primary Examiner* — Tahseen Khan
(74) *Attorney, Agent, or Firm* — Lewis Roca Rothgerber Christie LLP

(57) ABSTRACT

A display device according to an exemplary embodiment includes: a display panel that includes a substrate and an emission layer; and a support film that overlaps the display panel, the display panel and the support film including a bending area, and the support film including a first groove disposed in the bending area and a first crack prevention layer disposed in the first groove.

8 Claims, 13 Drawing Sheets

(56) References Cited

U.S. PATENT DOCUMENTS

| | | | |
|---|---|---|---|
| 2015/0048329 A1 | 2/2015 | Kim | |
| 2015/0102296 A1* | 4/2015 | Kim | H01L 51/5253 257/40 |
| 2016/0204183 A1* | 7/2016 | Tao | H01L 51/0097 |
| 2017/0045914 A1* | 2/2017 | Namkung | G02F 1/133305 |
| 2017/0062760 A1* | 3/2017 | Kim | H01L 51/5253 |
| 2017/0121977 A1 | 5/2017 | Augustyniak | |
| 2017/0263887 A1 | 9/2017 | Han et al. | |
| 2017/0263890 A1 | 9/2017 | Chun | |
| 2017/0331073 A1* | 11/2017 | Choi | H01L 51/0096 |

FOREIGN PATENT DOCUMENTS

| | | |
|---|---|---|
| KR | 10-2014-0122595 A | 10/2014 |
| KR | 10-2015-0065554 A | 6/2015 |
| KR | 10-2016-0080289 A | 7/2016 |
| KR | 10-2017-0016299 A | 2/2017 |
| KR | 10-2017-0037384 A | 4/2017 |
| KR | 10-2017-0038731 A | 4/2017 |
| KR | 10-2017-0106558 A | 9/2017 |
| KR | 10-2017-0106590 A | 9/2017 |
| KR | 10-2017-0128683 | 11/2017 |

OTHER PUBLICATIONS

Office Action issued in U.S. Appl. No. 16/207,208 by the USPTO, dated Jul. 25, 2019, 9 pages.
Final Office Action issued in U.S. Appl. No. 16/207,208 by the USPTO, dated Jan. 17, 2020, 10 pages.
U.S. Office Action dated Oct. 7, 2020, issued in U.S. Appl. No. 16/207,208 (13 pages).

* cited by examiner

FILM FOR DISPLAY DEVICE AND DISPLAY DEVICE INCLUDING THE SAME

CROSS-REFERENCE TO RELATED APPLICATION

This application claims priority to and the benefit of Korean Patent Application No. 10-2018-0016463 filed in the Korean Intellectual Property Office on Feb. 9, 2018, the entire contents of which are incorporated herein by reference.

BACKGROUND

1. Field

The present disclosure relates to a film for a display device, a display device including the same, and a method for manufacturing the display device. For example, the present disclosure relates to a film for a bendable display device, a display device including the same, and a manufacturing method thereof.

2. Description of the Related Art

Examples of a flat panel display include a liquid crystal display (LCD), a plasma display device (PDP), an organic light emitting diode (OLED) display, a field effect display device (FED), and an electrophoretic display.

Recently, such a display device has been developed to be flexible so as to be bent or folded.

In order to assure reliability of such a flexible display device, a bending area of a display panel should be rigidly supported to thereby prevent the display panel from being damaged in the bending area (or to thereby reduce a likelihood or amount of such damage).

The above information disclosed in this Background section is only for enhancement of understanding of the background of the present disclosure, and therefore, it may contain information that does not form the prior art that is already known in this country to a person of ordinary skill in the art.

SUMMARY

The subject matter of the present disclosure has been made in an effort to provide a film for display device to support a bending area of the display device by preventing damage to a support film that supports a display panel, a display device including the same, and a method for manufacturing the display device.

A support film that supports a display panel according to exemplary embodiment includes a bending area, and the support film includes a first groove disposed in the bending area and a first crack prevention layer disposed in the first groove.

A display device according to an exemplary embodiment includes: a display panel that includes a substrate and an emission layer; and a support film that overlaps the display panel, wherein the display panel and the support film include a bending area, and wherein the support film includes a first groove disposed in the bending area and a first crack prevention layer disposed in the first groove.

The first groove and the first crack prevention layer may be disposed to be overlapped with edges of the bending area.

The first groove and the first crack prevention layer may be disposed adjacent to edges of the bending area, and may extend in parallel (e.g., substantially in parallel) with the edges of the bending area.

The support film may further include a second groove that is disposed in the bending area and extends in parallel (e.g., substantially in parallel) with the first groove, and a second crack prevention layer that is disposed in the second groove.

The first groove and the first crack prevention layer may be disposed at a central portion of the bending area, and the first groove may be formed to be concave at a surface of the support film.

The support film may further include a second groove that surrounds the first groove, and a second crack prevention layer that is disposed in the second groove.

The support film may further include a third groove that is coupled or connected with the first groove and formed in the shape of a closed curved line (e.g., a closed curve), and a third crack prevention layer that is disposed in the third groove.

According to the exemplary embodiments, the support film that supports the display panel can be prevented from being damaged such that the display device can be supported while preventing the display panel from being damaged in the bending area.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
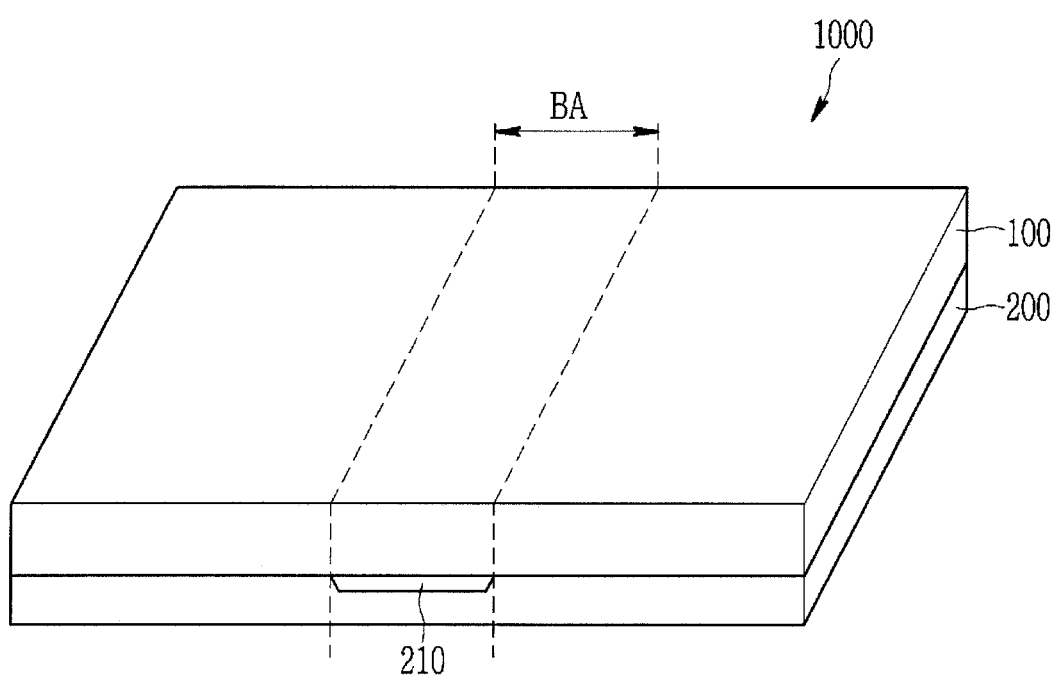
FIG. 1 is a perspective view of a display device according to an exemplary embodiment.

The subject matter of the present disclosure will be described more fully hereinafter with reference to the accompanying drawings, in which exemplary embodiments of the present disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

Further, in the drawings, size and thickness of each element may be arbitrarily represented for better understanding and ease of description, but the present disclosure is not limited thereto. In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from a side.

Figure 2:
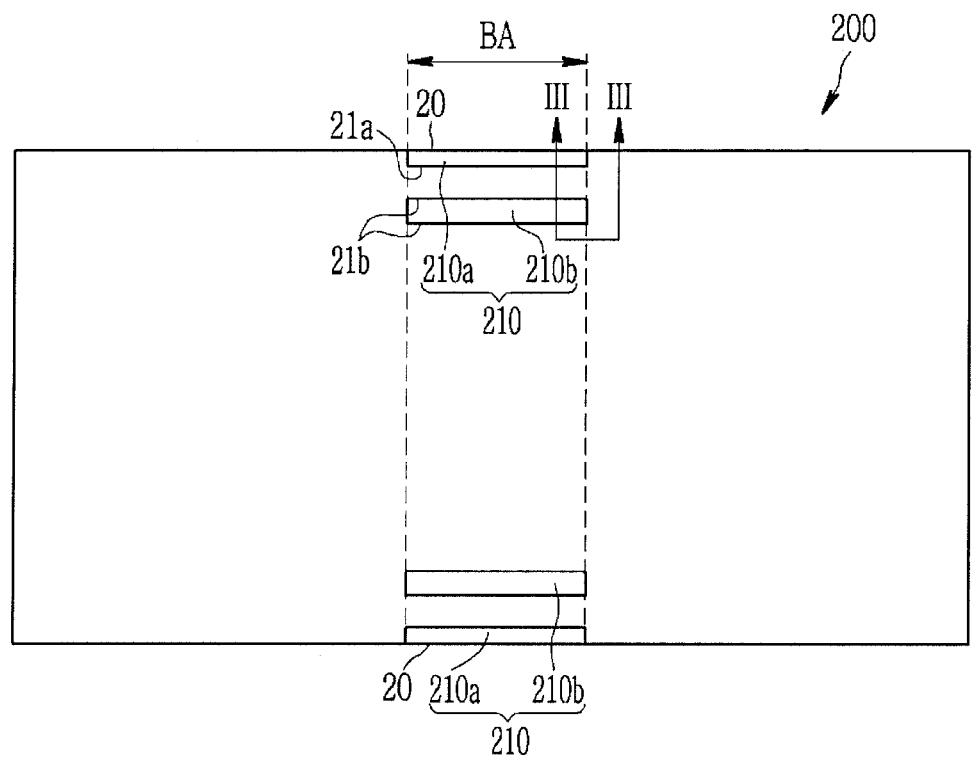
FIG. 2 is a top plan view of an exemplary support film of the display device according to an exemplary embodiment.
Figure 3:
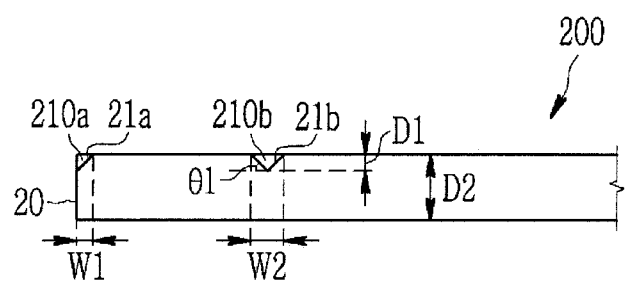
FIG. 3 is a cross-sectional view of FIG. 2, taken along the line III-Ill.

Referring to FIG. 1 to FIG. 3, a display device according to an exemplary embodiment will be described. FIG. 1 is a perspective view of a display device according to an exemplary embodiment, FIG. 2 is a top plan view of an exemplary support film of the display device according to the exemplary embodiment, and FIG. 3 is a cross-sectional view of FIG. 2, taken along the line III-III.

Referring to FIG. 1, a display device 1000 according to an exemplary embodiment includes a display panel 100 and a support film 200 that supports the display panel 100.

The display device 1000 includes a bending area BA. The display panel 100 and the support film 200 may be bent in the bending area BA. Although it is illustrated in FIG. 1 that the display device 1000 includes one bending area Ba, this is not restrictive. For example, the display device 1000 may include a plurality of bending areas BA.

The display panel 100 includes a flexible substrate, a transistor, an emission portion, and the like.

The support film 200 is disposed below the display panel 100 and supports the display panel 100.

An additional layer such as an adhesive layer may be disposed between the support film 200 and the display panel 100. An additional layer such as a window and/or the like may be included on the display panel 100.

The support film 200 may be provided as a plastic or thin metal film.

The support film 200 includes a first crack prevention portion 210 that is disposed in the bending area BA. The first crack prevention portion 210 may include a resin that can prevent damage due to an external impact (or can reduce a likelihood or amount of damage due to an external impact).

Next, referring to FIG. 2 and FIG. 3, the first crack prevention portion 210 of the support film 200 will be described in more detail.

Referring to FIG. 2 and FIG. 3, the first crack prevention portion 210 of the support film 200 includes a plurality of crack prevention layers that are disposed at an end portion of the bending area BA. The plurality of crack prevention layers of the first crack prevention portion 210 includes a first crack prevention layer 210a and a second crack prevention layer 210b.

The support film 200 includes a first groove 21a and a second groove 21b, and the first crack prevention layer 210a and the second crack prevention layer 210b are disposed in the first groove 21a and the second groove 21b.

The first crack prevention layer 210a of the first crack prevention portion 210 is disposed in parallel (e.g., substantially in parallel) with an edge 20 of the support film 200 along the edge 20.

The second crack prevention layer 210b of the first crack prevention portion 210 is disposed in parallel (e.g., substantially in parallel) with the first crack prevention layer 210a at a set or predetermined distance while being adjacent thereto. The first crack prevention layer 210a and the second crack prevention layer 210b are respectively disposed at opposite ends of a bending area BA of the support film 200.

A width of each of the first crack prevention layer 210a and the second crack prevention layer 210b is almost the same as a width of the bending area BA of the support film 200 with reference to a length direction in which each of the first crack prevention layer 210a and the second crack prevention layer 210b of the first crack prevention portion 210 extends. As described, since the width of each of the first crack prevention layer 210a and the second crack prevention layer 210b of the first crack prevention portion 210 is the same (e.g., substantially the same) as the width of the bending area BA, a central portion of the bending area BA may be surrounded by the first crack prevention layer 210a and the second crack prevention layer 210b of the first crack prevention portion 210 and an unbent area.

Referring to FIG. 3, a first thickness D1, which is the largest or maximum thickness of a first groove 21a and a second groove 21b where the first crack prevention layer 210a and the second crack prevention layer 210b are respectively disposed, may be about 20% of a second thickness D2 of the support film 200. In addition, in the view in a direction that is perpendicular (e.g., substantially perpendicular) to a length direction of the first crack prevention layer 210a and the second crack prevention layer 210b, a cross-section of the first groove 21a and a cross-section of the second groove 21b may have a triangular shape, and a first angle 81 formed by a side surface of the first groove 21a and the second groove 21b and a surface of the support film 200 may be about 60 degrees.

In addition, a first width W1 of the first crack prevention layer 210a may be narrower than a second width W2 of the second crack prevention layer 210b with reference to a direction that is perpendicular (e.g., substantially perpendicular) to the length direction of the first crack prevention layer 210a and the second crack prevention layer 210b.

When the first thicknesses D1 of the first groove 21a and the second groove 21b where the first crack prevention layer 210a and the second crack prevention layer 210b are disposed are too large, the support film 200 may be damaged at locations where the first groove 21a and the second groove 21b are formed, and when the first angles 81 formed by the side surfaces of the first and second grooves 21a and 21b and the surface of the support film 200 is less than 60 degrees, the width of the first crack prevention layer 210a and the width of the second crack prevention layer 210b disposed in the first groove 21a and the second groove 21b may be excessively increased. As described, the support film 200 can be prevented from being damaged and generation and dispersion of cracks can be prevented by adjusting thicknesses and inclination angles of the first groove 21a and the second groove 21b.

As described, the display device according to the present exemplary embodiment includes the support film 200 that supports the display panel 100, and the support film 200 includes the first crack prevention layer 210a disposed at an end of the bending area BA and the second crack prevention layer 210b disposed adjacent to the first crack prevention layer 210a.

Since the first crack prevention layer 210a disposed at the end of the bending area BA and the second crack prevention layer 210b disposed adjacent to the end of the bending area BA while being adjacent to the first crack prevention layer 210a are included, cracks which may be generated at edges of the bending area BA of the support film 200 when the display device 1000 is bent can be prevented (or a likelihood or degree of the generation of such cracks may be reduced), and the cracks generated at the edges of the bending area BA can be prevented from spreading to a central portion of the support film 200 (or a likelihood or degree of such spreading may be reduced).

As described, the generation and spread of cracks in the support film 200 due to bending of the display device 1000 can be prevented or reduced, and thus damage to the support film 200 due to the cracks can be prevented or reduced, thereby stably supporting the display panel 100.

Figure 4:
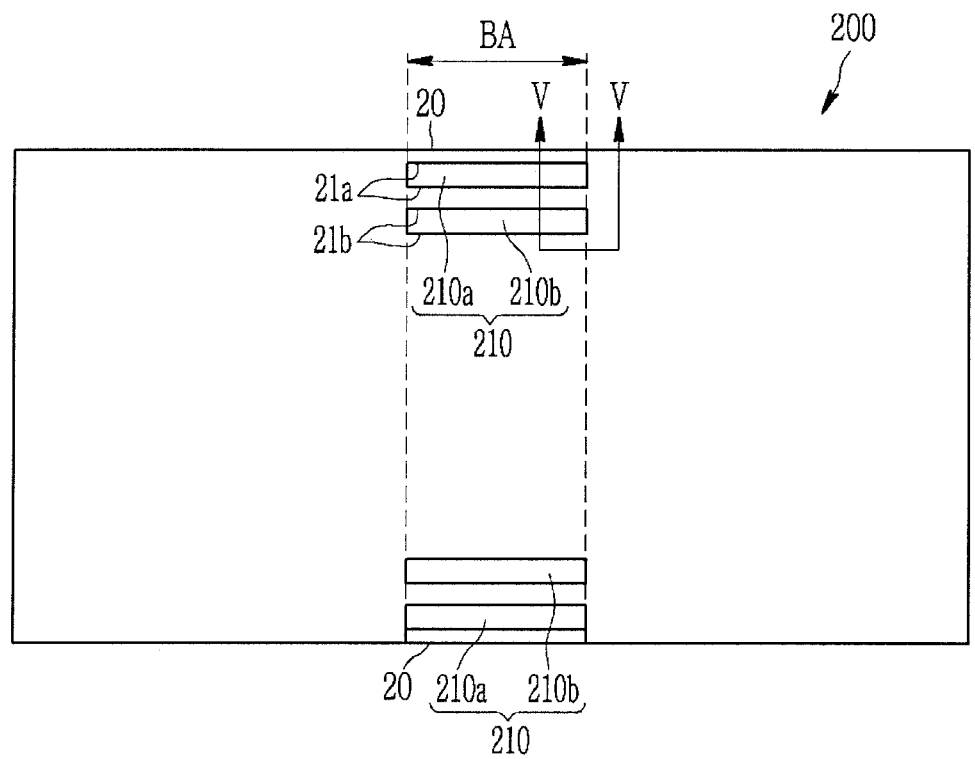
FIG. 4 is a top plan view of a support film of a display device according to another exemplary embodiment.

Next, referring to FIG. 4 and FIG. 5, a support film of a display device according to another exemplary embodiment will be described. FIG. 4 is a top plan view of a support film of a display device according to another exemplary embodiment, and FIG. 5 is a cross-sectional view of FIG. 4, taken along the line V-V.

Figure 5:
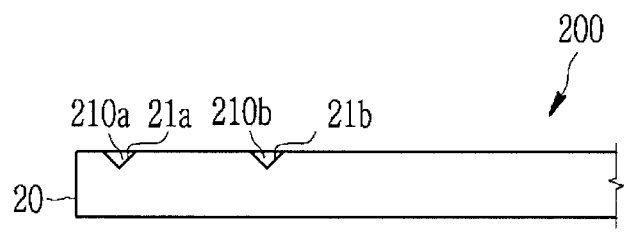
FIG. 5 is a cross-sectional view of FIG. 4, taken along the line V-V.

Referring to FIG. 4 and FIG. 5, a support film of a display device according to the present exemplary embodiment is similar to the support film of the display device according to the previous exemplary embodiment described with reference to FIG. 2 and FIG. 3. Accordingly, a detailed description of the same components already described will not be repeated here.

Similar to the support film 200 of the display device of FIG. 2 and FIG. 3, a support film 200 of a display device according to the present exemplary embodiment includes first crack prevention portions 210 disposed adjacent to edges of a bending area BA, each of the first crack prevention portions 210 includes a plurality of crack prevention layers, and the plurality of crack prevention layers include first crack prevention layers 210a and second crack prevention layers 210b.

The support film 200 includes a first groove 21a and a second groove 21b, the first crack prevention layer 210a and the second crack prevention layer 210b are respectively disposed in the first groove 21a and the second groove 21b, and the first crack prevention layers 210a and the second crack prevention layers 210b extend in parallel (e.g., substantially in parallel) with edges of the support film 200.

Unlike the support film 200 of the display device of FIG. 2 and FIG. 3, in the support film 200 of the display device according to the present exemplary embodiment, not only the second crack prevention layer 210b but also the first crack prevention layer 210a is disposed at a distance from the edge 20 of the support film 200.

The first crack prevention layer 210a is disposed closer to the edge 20 of the support film 200 than the second crack prevention layer 210b.

A width of each of the first and second crack prevention layers 210a and 210b of the first crack prevention portion 210 is almost the same as a width of the bending area BA of the support film 200 with reference to a length direction in which the first crack prevention layer 210a and the second crack prevention layer 210b extend.

The largest or maximum thicknesses of the first groove 21a and the second groove 21b where the first crack prevention layer 210a and the second crack prevention layer 210b are respectively disposed may be about 20% of a thickness of the support film 200. In addition, in the view in a direction that is perpendicular (e.g., substantially perpendicular) to a length direction of the first crack prevention layer 210a and the second crack prevention layer 210b, a cross-section of the first groove 21a and a cross-section of the second groove 21b may have a triangular shape, and a side surface of each of the first groove 21a and the second groove 21b and a surface of the support film 200 may form an angle of about 60 degrees.

Since the support film 200 that supports the display panel 100 includes the first crack prevention layers 210a and the second crack prevention layers 210b that are disposed adjacent to opposite edges 20 of the bending area BA, cracks which may be generated at edges of the bending area BA of the support film 200 when the display device 1000 is bent can be prevented (or a likelihood or degree of the generation of such cracks may be reduced), and the cracks generated at the edges of the bending area BA can be prevented from spreading to a central portion of the support film 200 (or a likelihood or degree of the spreading of such cracks may be reduced).

As described, the generation and spread of cracks in the support film 200 due to bending of the display device 1000 can be prevented or reduced, and thus damage to the support film 200 due to the cracks can be prevented or reduced, thereby stably supporting the display panel 100.

Figure 6:
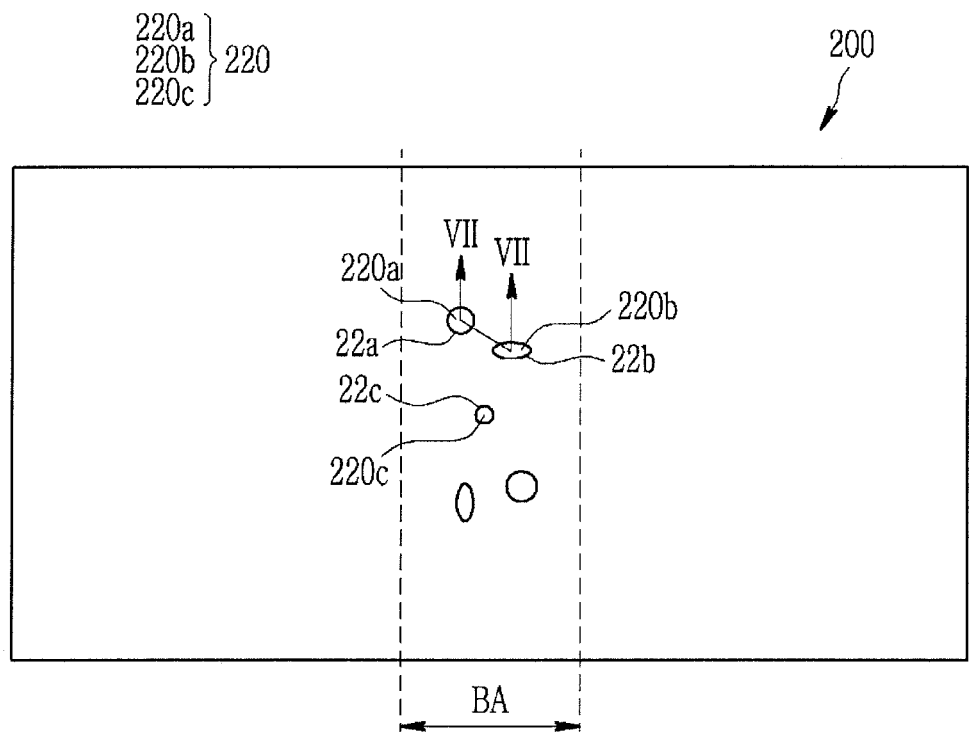
FIG. 6 is a top plan view of a support film of a display device according to another exemplary embodiment.

Next, referring to FIG. 6 and FIG. 7, a support film of a display device according to another exemplary embodiment will be described. FIG. 6 is a top plan view of a support film of a display device according to another exemplary embodiment, and FIG. 7 is a cross-sectional view of FIG. 6, taken along the line VII-VII.

Figure 7:
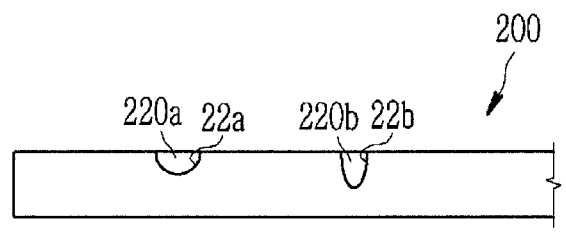
FIG. 7 is a cross-sectional view of FIG. 6, taken along the line VII-VII.

Referring to FIG. 6 and FIG. 7, a support film 200 of a display device according to the present exemplary embodiment includes a second crack prevention portion 220 disposed in a bending area BA.

The second crack prevention portion 220 includes a plurality of crack prevention layers disposed at a central portion of the bending area BA. The plurality of crack prevention layers of the second crack prevention portion 220 include a third crack prevention layer 220a, a fourth crack prevention layer 220b, and a fifth crack prevention layer 220c.

The support film 200 of the display device according to the present exemplary embodiment includes a third groove 22a, a fourth groove 22b, and a fifth groove 22c, and the third crack prevention layer 220a, the fourth crack prevention layer 220b, and the fifth crack prevention layer 22 of the second crack prevention portion 220 are respectively disposed in the third groove 22a, the fourth groove 22b, and the fifth groove 22c that are formed at the surface of the support film 200.

The third groove 22a, the fourth groove 22b, and the fifth groove 22c formed at the surface of the support film 200 are disposed in the central portion of the bending area BA. Referring to FIG. 6 and FIG. 7, the third groove 22a, the fourth groove 22b, and the fifth groove 22b of the support film 200 may be different in size and depth. The third groove 22a, the fourth groove 22b, and the fifth groove 22b formed at the surface of the support film 200 may be flaws formed at the surface of the support film 200 during a manufacturing process of the support film 200.

Since the crack prevention layers 220a, 220b, and 220c are formed in the grooves 22a, 22b, and 22c at the central portion of the bending area BA of the support film 200, cracks which may be generated at areas adjacent to the center of the bending area BA of the support film 200 when the display device 1000 is bent can be prevented (or a likelihood or degree of the generation of such cracks may be reduced), and the cracks generated at the edges of the bending area BA can be prevented from spreading to edges of the support film 200 (or a likelihood or degree of the spreading of such cracks may be reduced).

As described, the generation and spread of cracks in the support film 200 due to bending of the display device 1000 can be prevented or reduced, and thus damage to the support film 200 due to the cracks can be prevented or reduced, thereby stably supporting the display panel 100.

Figure 8:
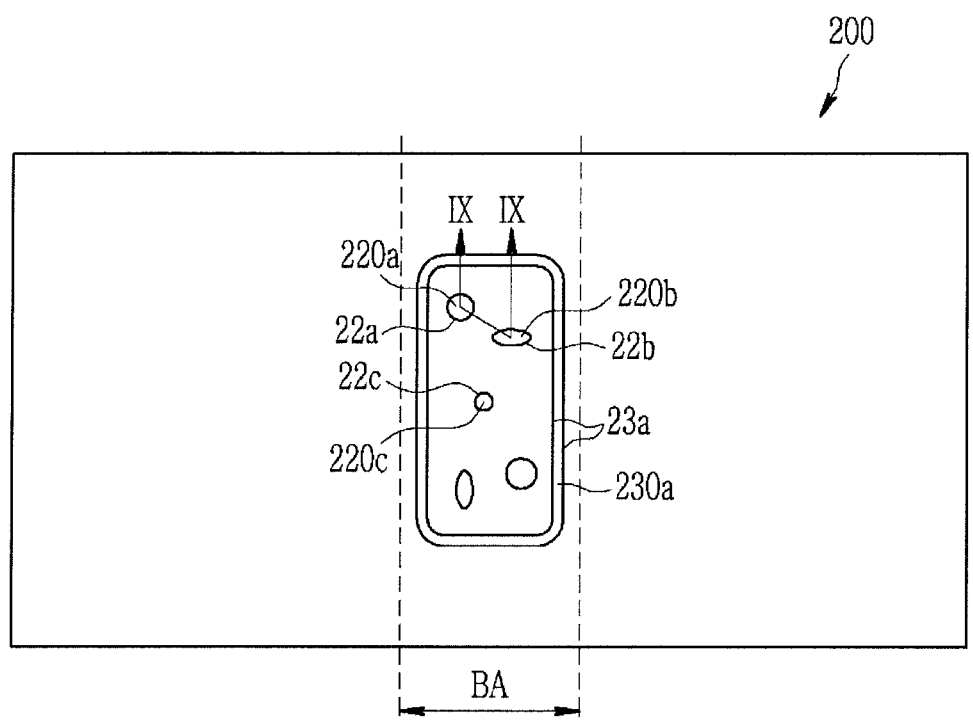
FIG. 8 is a top plan view of a support film of a display device according to another exemplary embodiment.

Next, referring to FIG. 8 and FIG. 9, a support film of a display device according to another exemplary embodiment will be described with reference to FIG. 8 and FIG. 9. FIG. 8 is a top plan view of a support film of a display device according to another exemplary embodiment, and FIG. 9 is a cross-sectional view of FIG. 8, taken along the line IX-IX.

Figure 9:
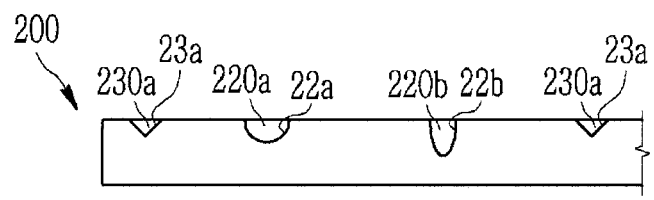
FIG. 9 is a cross-sectional view of FIG. 8, taken along the line IX-IX.

Referring to FIG. 8 and FIG. 9, a support film of a display device according to the present exemplary embodiment is similar to the support film of the display device according to the previous exemplary embodiment described with reference to FIG. 6 and FIG. 7. Accordingly, a detailed description of the same components already described will not be repeated here.

Similar to the support film 200 of the display device of FIG. 6 and FIG. 7, a support film 200 of a display device according to the present exemplary embodiment includes a second crack prevention portion 220 disposed adjacent to a central portion of a bending area BA, and the second crack prevention portion 220 includes a third crack prevention layer 220a, a fourth crack prevention layer 220b, and a fifth crack prevention layer 220c. The support film 200 includes a third groove 22a, a fourth groove 22b, and a fifth groove 22c formed at a surface of the support film 200, and the third crack prevention layer 220a, the fourth crack prevention layer 220b, and the fifth crack prevention layer 220c of the second crack prevention portion 220 are disposed in the third groove 22a, the fourth groove 22b, and the fifth groove 22b formed at the surface of the support film 200.

The support film 200 of the display device according to the present exemplary embodiment, unlike the support film of the display device of FIG. 6 and FIG. 7, further includes a sixth crack prevention layer 230a that surrounds the second crack prevention portion 220 that is disposed at the central portion of the bending area BA. The support film 200 according to the present exemplary embodiment includes a sixth groove 23a that surrounds the third groove 22a, the fourth groove 22b, and the fifth groove 22c that are formed at the surface of the central portion of the bending area BA, and the sixth crack prevention layer 230a is disposed in the sixth groove 23a.

The sixth groove 23a of the support film 200 may be formed to surround the third groove 22a, the fourth groove 22b, and the fifth groove 22c that are formed at the surface of the central portion of the bending area BA. The sixth groove 23a and the sixth crack prevention layer 230a each has a closed-curved line shape.

Similar to the first groove 21a and the second groove 21b of the above-described exemplary embodiments of FIG. 2, FIG. 3, FIG. 4, and FIG. 5, the sixth groove 23a may have a triangular-shaped cross-section. In addition, a side surface of the sixth groove 23a and the surface of the support film 200 may form an angle of about 60 degrees. Further, the largest or maximum depth of the sixth groove 23a may be within 20% of a thickness of the support film 200.

As described, the support film 200 of the display device according to the present exemplary embodiment includes the second crack prevention portion 220 that is formed at the surface of the central portion of the bending area BA and the sixth crack prevention layer 230a that surrounds the second crack prevention portion 220, and thus cracks which may be generated at areas adjacent to the center of the bending area BA of the support film 200 when the display device 1000 is bent can be prevented (or a likelihood or degree of the generation of such cracks may be reduced), and the cracks generated at the center of the bending area BA can be prevented from spreading to edges of the bending area BA (or a likelihood or degree of the spreading of such cracks may be reduced).

As described, the generation and spread of cracks in the support film 200 due to bending of the display device 1000 can be prevented or reduced, and thus damage to the support film 200 due to the cracks can be prevented or reduced, thereby stably supporting the display panel 100.

Figure 10:
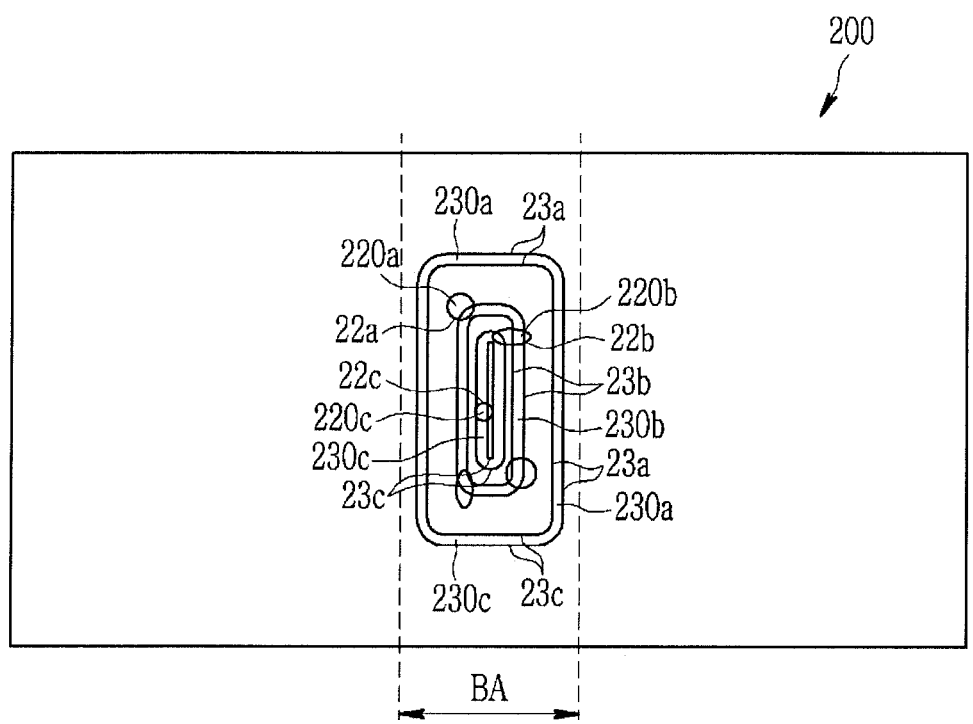
FIG. 10 is a top plan view of a support film of a display device according to another exemplary embodiment.

Next, a support film 200 of a display device according to another exemplary embodiment will be described with reference to FIG. 10. FIG. 10 is a top plan view of a support film of a display device according to another exemplary embodiment.

Referring to FIG. 10, a support film 200 of a display device according to the present exemplary embodiment is similar to the support film of the display device of FIG. 8 and FIG. 9. Accordingly, a detailed description of the same components already described will not be repeated here.

Similar to the support film 200 of the display device of FIG. 8 and FIG. 9, the support film 200 of the display device according to the present exemplary embodiment includes a second crack prevention portion 220 disposed adjacent to a central portion of a bending area BA, and the second crack prevention portion 220 includes a third crack prevention layer 220a, a fourth crack prevention layer 220b, and a fifth crack prevention layer 220c. The support film 200 includes a third groove 22a, a fourth groove 22b, and a fifth groove 22c formed at a surface thereof, and the third crack prevention layer 220a, the fourth crack prevention layer 220b, and the fifth crack prevention layer 220c of the second crack prevention portion 220 are disposed in the third groove 22a, the fourth groove 22b, and the fifth groove 22c formed at the surface of the support film 200. In addition, the support film 200 includes a sixth groove 23a that surrounds the second crack prevention portion 220 disposed at a central portion of the bending area BA, and a sixth crack prevention layer 230a disposed in the sixth groove 23a. The support film 200 according to the present exemplary embodiment further includes a seventh groove 23b and an eighth groove 23c disposed at the central portion of the bending area BA surrounded by the sixth groove 23a and the sixth crack prevention layer 230b, and a seventh crack prevention layer 230b and an eighth crack prevention layer 230c disposed in the seventh groove 23b and the eighth groove 23c. The seventh groove 23b and the eighth groove 23c are coupled or connected with the third crack prevention layer 220a, the fourth crack prevention layer 230b, and the fifth crack prevention layer 220c respectively disposed in the third groove 22a, the fourth groove 22b, and the fifth groove 22c formed at the surface of the central portion of the bending area BA.

The sixth groove 23a, the sixth crack prevention layer 230a, the seventh groove 23b, the seventh crack prevention layer 230b, the eighth groove 23c, and the eighth crack prevention layer 230c each has a closed curved line shape (e.g., each is a closed curve).

As described above, the support film 200 of the display device according to the present exemplary embodiment further includes the seventh groove 23b and the eighth groove 23c that are coupled or connected with the second crack prevention portion 200 that is disposed in a center portion of the bending area BA and surround the center portion of the bending area, and the seventh crack prevention layer 230b and the eighth crack prevention layer 230c that are respectively disposed in the seventh groove 23b and the eighth groove 23c. Thus, cracks which may be generated in areas adjacent to the center of the bending area BA of the support film 200 when a display device 1000 is bent in the bending area BA of the display device 1000 can be prevented (or a likelihood or degree of the generation of such cracks may be reduced), and the cracks generated at the center of the bending area BA can be prevented from being additionally spread toward edges of the bending area BA from the central portion of the bending area BA (or a likelihood or degree of the spreading of such cracks may be reduced).

As described, the generation and spread of cracks in the support film 200 due to bending of the display device 1000 can be prevented or reduced, and thus damage to the support film 200 due to the cracks can be prevented or reduced, thereby stably supporting the display panel 100.

Figure 11:
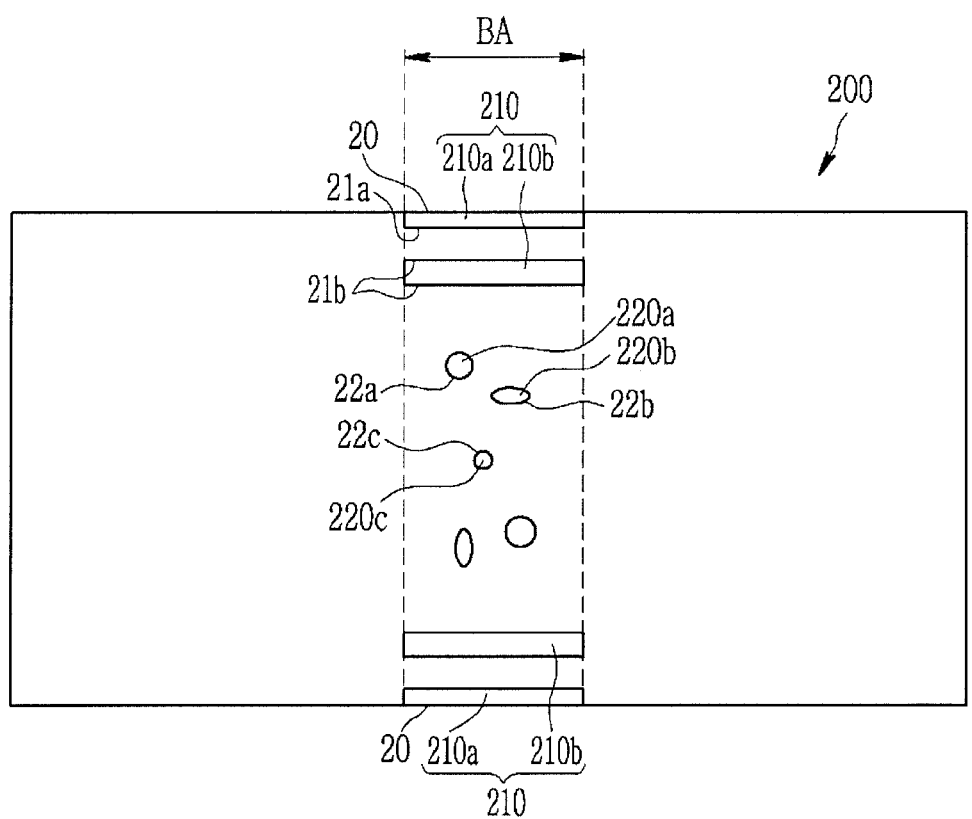
FIG. 11 is a top plan view of a support film of a display device according to another exemplary embodiment.

Referring to FIG. 11, a support film of a display device according to another exemplary embodiment will be described. FIG. 11 is a top plan view of a support film of a display device according to another exemplary embodiment.

Referring to FIG. 11, a support film of a display device according to the present exemplary embodiment is similar to the support film of the display device of FIG. 2 and FIG. 3 and the support film of the display device of FIG. 6 and FIG. 7. Accordingly, a detailed description of the same components already described will not be repeated here.

A support film 200 of the display device according to the present exemplary embodiment includes first crack prevention portions 210 disposed in a bending area and a second crack prevention portion 220 disposed adjacent to a central portion of the bending area BA.

The first crack prevention portion 210 of the support film 200 includes a first crack prevention layer 210a and a second crack prevention layer 210b, the support film 200 includes a first groove 21a and a second groove 21b, and the first crack prevention layer 210a and the second crack prevention layer 210b are disposed in the first groove 21a and the second groove 21b.

Further the second crack prevention portion 220 of the support film 200 includes a third crack prevention layer 220a, a fourth crack prevention layer 220b, and a fifth crack prevention layer 220c. The support film 200 includes a third groove 22a, a fourth groove 22b, and a fifth groove 22c formed at a surface of the support film 200, and the third crack prevention layer 220a, the fourth crack prevention layer 220b, and the fifth crack prevention layer 220c of the second crack prevention portion 220 are disposed in the third groove 22a, the fourth groove 22b, and the fifth groove 22c formed at the surface of the support film 200.

Since the first crack prevention layers 210a disposed at ends of the support film 200 that supports the display panel 100 and the second crack prevention layers 210b disposed at end portions of the bending area BA while being adjacent to the first crack prevention layers 210a are included, cracks which may be generated at edges of the bending area BA of the display device 1000 when the display device 1000 is bent at the bending area BA of the support film 200 can be prevented from being generated, and the cracks generated at edges of the bending area BA can be prevented from spreading to a central portion of the support film 200. Further, since the crack prevention layers 220a, 220b, and 220c are formed in the grooves 22a, 22b, and 22c of the central portion of the bending area BA of the support film 200, cracks which may be generated in an area adjacent to the center of the bending area BA of the support film 200 when the display device 1000 is bent at the bending area BA of the support film 200 can be prevented from being generated (or a likelihood or degree of the generation of such cracks may be reduced), and the cracks generated at the center of the bending area BA can be prevented from spreading to the edges of the bending area BA (or a likelihood or degree of the spreading of such cracks may be reduced).

As described, the generation and spread of cracks in the support film 200 due to bending of the display device 1000 can be prevented or reduced, and thus damage to the support film 200 due to the cracks can be prevented or reduced, thereby stably supporting the display panel 100.

Figure 12:
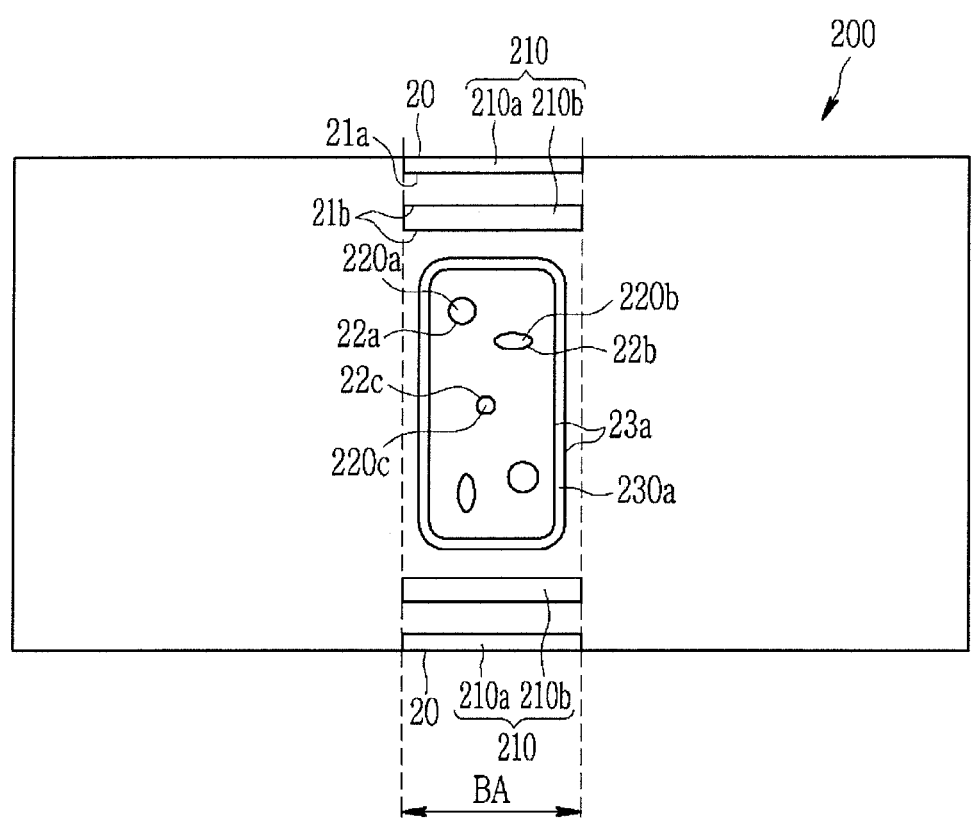
FIG. 12 is a top plan view of a support film of a display device according to another exemplary embodiment.

Next, referring to FIG. 12, a support film of a display device according to another exemplary embodiment will be described. FIG. 12 is a top plan view of a support film of a display device according to another exemplary embodiment.

Referring to FIG. 12, a support film of a display device according to the present exemplary embodiment is similar to the support film of the display device of FIG. 2 and FIG. 3 and the support film of the display device of FIG. 8 and FIG. 9. Accordingly, a detailed description of the same components already described will not be repeated here.

A support film 200 of the display device according to the present exemplary embodiment includes first crack prevention portions 210 disposed in a bending area BA, a second crack prevention portion 220 disposed adjacent to a central portion of the bending area BA, and a sixth crack prevention layer 230a that surrounds the second crack prevention portion 220.

The first crack prevention portion 210 of the support film 200 includes a first crack prevention layer 210a and a second crack prevention layer 210b, the support film 200 includes a first groove 21a and a second groove 21b, and the first crack prevention layer 210a and the second crack prevention layer 210b are disposed in the first groove 21a and the second groove 21b.

In addition, the second crack prevention portion 220 of the support film 200 includes a third crack prevention layer 220a, a fourth crack prevention layer 220b, and a fifth crack prevention layer 220c. The support film 200 includes a third groove 22a, a fourth groove 22b, and a fifth groove 22c formed at a surface thereof, and the third crack prevention layer 220a, the fourth crack prevention layer 220b, and the fifth crack prevention layer 220c of the second crack prevention portion 220 are disposed in the third groove 22a, the fourth groove 22b, and the fifth groove 22c formed at the surface of the support film 200.

In addition, the sixth crack prevention layer 230a of the support film 200 surrounds the second crack prevention portion 220 that is disposed at a central portion of the bending area BA.

Since the first crack prevention layer 210a disposed at the end of the bending area BA and the second crack prevention layer 210b disposed adjacent to the end of the bending area BA while being adjacent to the first crack prevention layer 210a are included, cracks which may be generated at edges of the bending area BA of the support film 200 when the display device 1000 is bent can be prevented (or a likelihood or degree of the generation of such cracks may be reduced), and the cracks generated at the edges of the bending area BA can be prevented from spreading to a central portion of the support film 200 (or a likelihood or degree of the spreading of such cracks may be reduced). In addition, the crack prevention layers 220a, 220b, and 220c are formed in the grooves 22a, 22b, and 22c in the central portion of the bending area BA of the support film 200 and the sixth crack prevention layer 230a that surrounds the second crack prevention portion 220 are included, and thus cracks which may be generated at an area adjacent to the center of the bending area BA of the support film 200 when the display device 1000 is bent can be prevented or reduced, and the cracks generated at the center of the bending area BA can be prevented from spreading to edges of the bending area BA (or a likelihood or degree of such spreading may be reduced).

As described, the generation and spread of cracks in the support film 200 due to bending of the display device 1000 can be prevented, and thus damage to the support film 200 due to the cracks can be prevented, thereby stably supporting the display panel 100.

Figure 13:
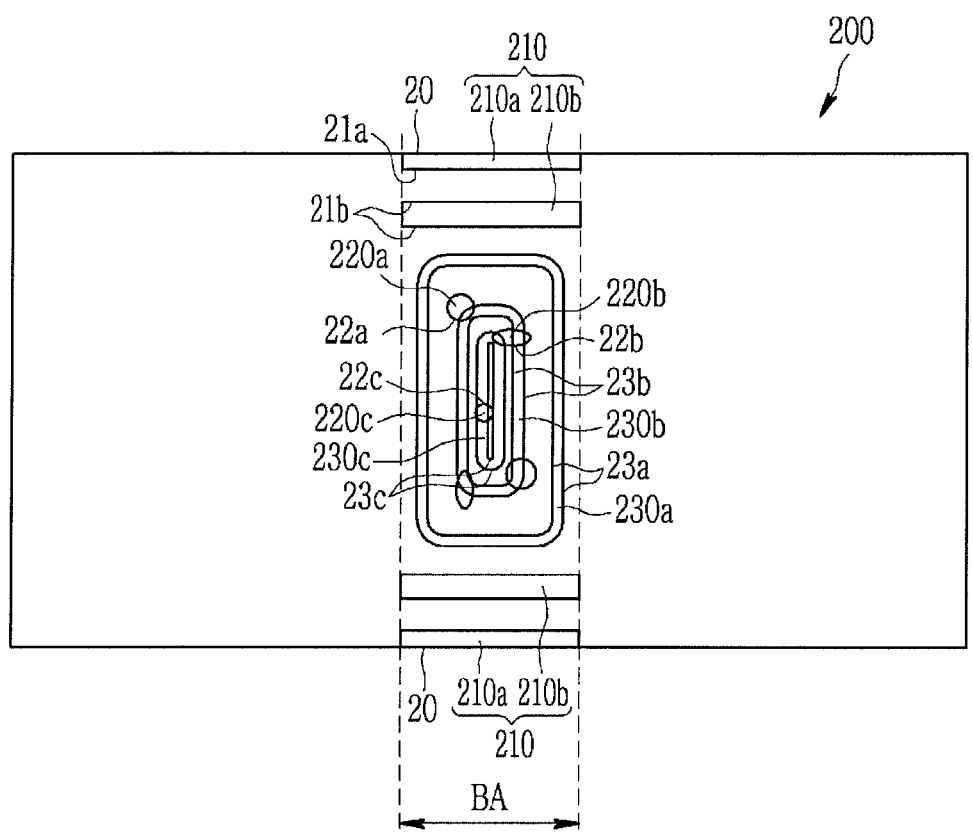
FIG. 13 is a top plan view of a support film of a display device according to another exemplary embodiment.

Next, a support film of a display device according to another exemplary embodiment will be described with reference to FIG. 13. FIG. 13 is a top plan view of a support film of a display device according to another exemplary embodiment.

Referring to FIG. 13, a support film 200 of a display device according to the present exemplary embodiment is similar to the support film of the display device of FIG. 2 and FIG. 3 and the support film of the display device of FIG. 10. Accordingly, a detailed description of the same components already described will not be repeated here.

The support film 200 of the display device according to the present exemplary embodiment includes first crack prevention portions 210 disposed in a bending area BA, a second crack prevention portion 220 disposed adjacent to a central portion of the bending area BA, a sixth crack prevention layer 230a that surrounds the second crack prevention portion 220, and seventh and eighth crack prevention layers 230b and 230c disposed in the central portion of the bending area BA that is surrounded by the sixth crack prevention layer 230a.

The first crack prevention portion 210 of the support film 200 includes a first crack prevention layer 210a and a second crack prevention layer 210b, the support film 200 includes a first groove 21a and a second groove 21b, and the first crack prevention layer 210a and the second crack prevention layer 210b are disposed in the first groove 21a and the second groove 21b.

In addition, the second crack prevention portion 220 of the support film 200 includes a third crack prevention layer 220a, a fourth crack prevention layer 220b, and a fifth crack prevention layer 220c. The support film 200 includes a third groove 22a, a fourth groove 22b, and a fifth groove 22c formed at a surface thereof, and the third crack prevention layer 220a, the fourth crack prevention layer 220b, and the fifth crack prevention layer 220c of the second crack prevention portion 220 are disposed in the third groove 22a, the fourth groove 22b, and the fifth groove 22c formed at the surface of the support film 200.

Further, the sixth crack prevention layer 230a of the support film 200 surrounds the second crack prevention portion 220 that is disposed at the central portion of the bending area BA. The seventh crack prevention layer 230b and the eighth crack prevention layer 230c of the support film 200 are coupled or connected with the second crack prevention portion 220 disposed at the central portion of the bending area BA and thus surround the center portion of the bending area BA.

Since the first crack prevention layer 210a disposed at the end of the bending area BA and the second crack prevention layer 210b disposed adjacent to the end of the bending area BA while being adjacent to the first crack prevention layer 210a are included, cracks which may be generated at edges of the bending area BA of the support film 200 when the display device 1000 is bent can be prevented (or a likelihood or degree of the generation of such cracks may be reduced), and the cracks generated at the edges of the bending area BA can be prevented from spreading to a central portion of the support film 200 (or a likelihood or degree of the spreading of such cracks may be reduced). In addition, the crack prevention layers 220a, 220b, and 220c are formed in the grooves 22a, 22b, and 22c in the central portion of the bending area BA of the support film 200, and the second crack prevention portion 220, the sixth crack prevention layer 230a that surrounds the second crack prevention portion 220, and the seventh and eighth crack prevention layers 230b and 230c that are coupled or connected with the second crack prevention portion 220 and disposed in a center area of the bending area BA surrounded by the sixth crack prevention layer 230a are provided, and thus when the display device 1000 is bent in the bending area BA of the display device 1000, cracks which may be generated in an area adjacent to the center of the bending area BA can be prevented from being generated (or a likelihood or degree of the generation of such cracks may be reduced), and spreading of the crack generated in the center of the bending area BA to edges of the bending area BA can be prevented or reduced.

As described, the generation and spread of cracks in the support film 200 due to bending of the display device 1000 can be prevented or reduced, and thus damage to the support film 200 due to the cracks can be prevented or reduced, thereby stably supporting the display panel 100.

Figure 14:
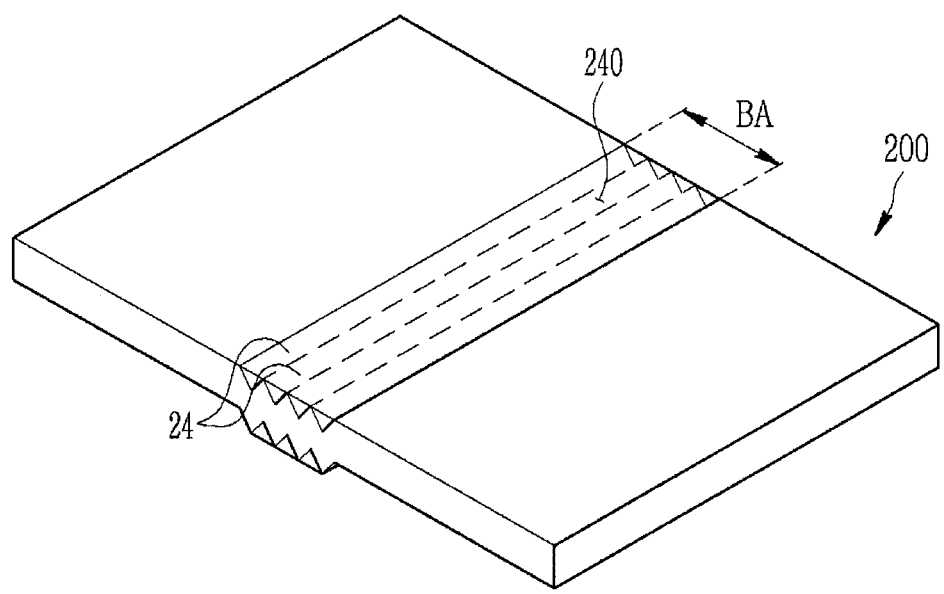
FIG. 14 is a perspective view of a support film of a display device according to another exemplary embodiment.

Next, referring to FIG. 14 and FIG. 15, a support film of a display device according to another exemplary embodiment will be described. FIG. 14 is a perspective view of a support film of a display device according to another exemplary embodiment, and FIG. 15 is a cross-sectional view of the support film of FIG. 14.

Figure 15:
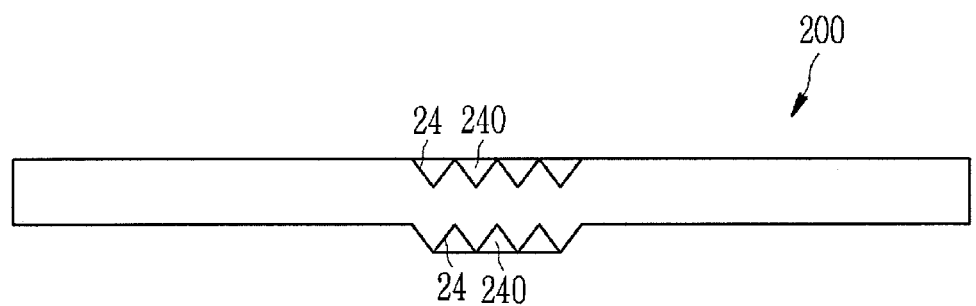
FIG. 15 is a cross-sectional view of the support film of FIG. 14.

Referring to FIG. 14 and FIG. 15, a support film 200 of a display device according to the present exemplary embodiment includes ridges and valleys 24 that are arranged at regular intervals while having a set or predetermined gap therebetween in a bending area BA. The ridges and valleys 24 of the support film 200 are formed at opposite surfaces of the support film 200.

Third crack prevention portions 240 are formed in the valleys 24 of the support film 200. The third crack prevention portions 240 fill the valleys 24 provided at the opposite surfaces of the support film 200.

As described, the bending area BA of the support film 200 includes the valleys 24, which are concave portions arranged at regular intervals, and the third crack prevention portions 240 disposed in the valleys 24, and thus when the display device 1000 is bent, cracks which may be generated in the bending area BA of the support film 200 can be prevented from being generated and spreading of the cracks can be prevented (or a likelihood or degree of the generation and spreading of such cracks may be reduced).

In addition, since the bending area BA has a flat surface by the third crack prevention portions 230 of the bending area BA, the crack prevention portion of the bending area BA can be prevented from being visible to the outside (or the visibility of the crack prevention portion of the bending area BA can be reduced).

As described, the generation and spread of cracks in the support film 200 due to bending of the display device 1000 can be prevented or reduced, and thus damage to the support film 200 due to the cracks can be prevented or reduced, thereby stably supporting the display panel 100.

Figure 16:
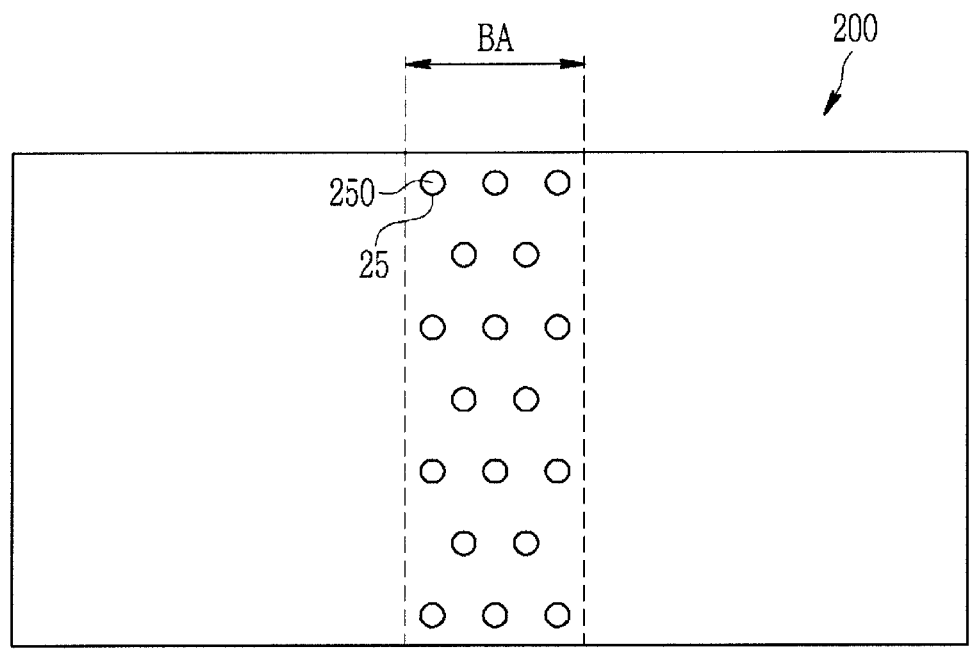
FIG. 16 is a top plan view of a support film of a display device according to another exemplary embodiment.
Figure 17:
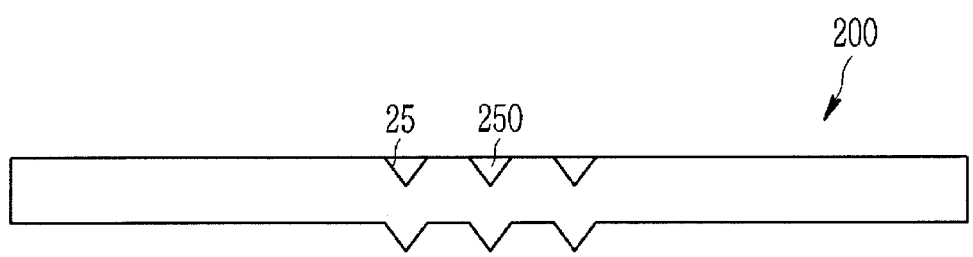
FIG. 17 is a cross-sectional view of the support film of FIG. 16.

Referring to FIG. 16 and FIG. 17, a support film of a display device according to another exemplary embodiment will be described. FIG. 16 is a top plan view of a support film of a display device according to another exemplary embodiment, and FIG. 17 is a cross-sectional view of the support film of FIG. 16.

Referring to FIG. 16 and FIG. 17, a support film 200 of a display device according to the present exemplary embodiment includes a plurality of ninth grooves 25 arranged at regular intervals, and fourth crack prevention portions 250 disposed in the plurality of ninth grooves 25.

The plurality of ninth grooves 25 and the fourth crack prevention portions 250 may be uniformly (e.g., substantially uniformly) disposed throughout the bending area BA.

In the present exemplary embodiment, each ninth groove 25 has a triangular-shaped cross-section, but this is not restrictive. The largest or maximum thickness of the ninth groove 25 may be about 20% of a thickness of the support film 200, and a side surface of the ninth groove 25 and a surface of the support film 200 may form an angle of about 60 degrees.

As described, since the plurality of ninth grooves 25 disposed at regular intervals throughout the bending area BA of the support film 200 and the fourth crack prevention portions 250 disposed in the plurality of ninth grooves 25 are provided, when a display device 1000 is bent, cracks which may be generated in the bending area BA of the support film 200 can be prevented from being generated, and spreading of the cracks can be prevented (or a likelihood or degree of the generation and spreading of such cracks may be reduced).

In addition, the fourth crack prevention portion 250 of the bending area BA has flat surface together with the surface of the support film 200, and accordingly, the bending area BA as a flat surface, thereby preventing or reducing the crack prevention portion of the bending area BA from being visible to the outside.

Figure 18:
FIG. 18 to FIG. 20 are cross-sectional views of a method for manufacturing a display device according to an exemplary embodiment.
Figure 19:
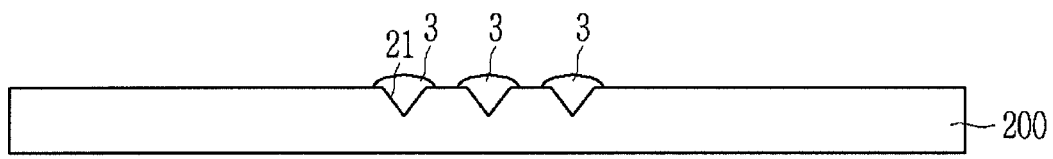
Figure 20:
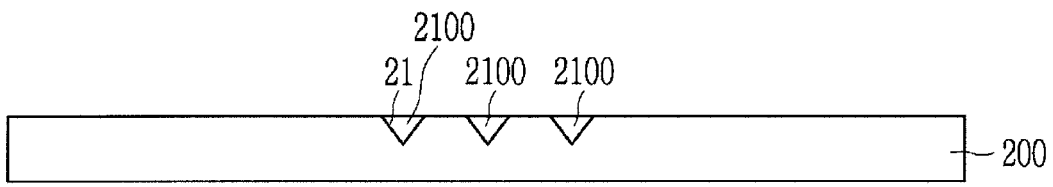

Next, a method for manufacturing a display device according to an exemplary embodiment will be described with reference to FIG. 18 to FIG. 20. FIG. 18 to FIG. 20 are cross-sectional views illustrating a manufacturing method of a display device according to an exemplary embodiment.

Referring to FIG. 18, a groove 21 is formed in a support film 200. The groove 21 may be formed by etching and/or the like. A first thickness D1 of the groove 21 may be about 20% of a second thickness D2 of the support film 200. A cross-section of the groove 21 may have a triangular shape, and a first angle 61 formed by a side surface of the groove 21 and a surface of the support film 200 may be about 60 degrees.

Next, as shown in FIG. 19, a crack prevention material layer 3 such as a resin and/or the like that forms a crack prevention layer is applied to the groove 21.

Then, the crack prevention material layer 3 disposed on the surface of the support film 200 is removed to planarize the surface of the support film 200 and a crack prevention layer 2100 such that, as shown in FIG. 20, the crack prevention layers 2100 are formed in the grooves 21 of the support film 200. The support film 200 including the grooves 21 and the crack prevention layers 2100 are attached to a display panel 100 that includes a substrate, a transistor, and an emission portion such that the display device 1000 shown in FIG. 1 is formed.

When the crack prevention layers 2100 are formed in the grooves 21 of the support film 200, the crack prevention portion of the bending area BA can be prevented from being viewed to the outside (or the visibility from the outside may be reduced) since the crack prevention layer 2100 and the bending area BA have flat surfaces.

Figure 21:
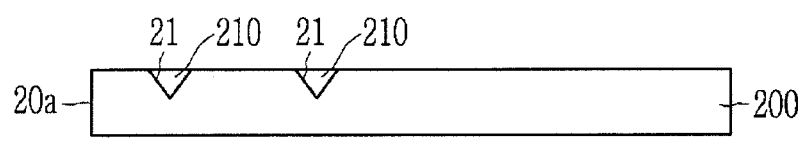
FIG. 21 to FIG. 22 are cross-sectional views of a method for manufacturing a display device according to another exemplary embodiment.
Figure 22:
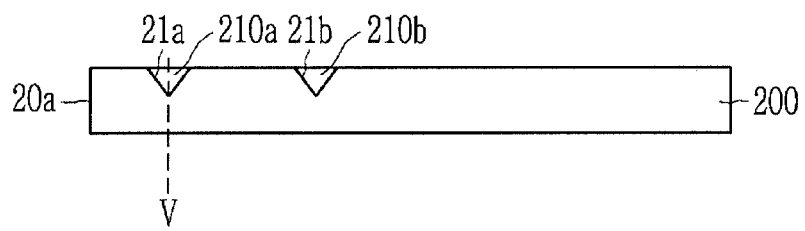

Next, a method for manufacturing a support film of a display device according to another exemplary embodiment will be described with reference to FIG. 21 and FIG. 22, together with FIG. 1 to FIG. 3. FIG. 21 to FIG. 22 are cross-sectional views of a manufacturing method of a display device according to another exemplary embodiment.

As shown in FIG. 21, grooves 21 are formed in a support film 200 and crack prevention layers 2100 are formed in the grooves 21, and as shown in FIG. 22, the support film 200 is cut along a position V that overlaps the first crack prevention layer 210a that is adjacent to a first edge 20a of the support film 200 to form an edge 20 such that, as shown in FIG. 1 to FIG. 3, the first crack prevention portion 210 that includes the first crack prevention layer 210a that extends along an edge of the bending area BA of the support film 200 is formed, and the display device 1000 shown in FIG. 1 to FIG. 3 is formed by attaching the support film 200 to a display panel 1000 that includes a substrate, a transistor, and an emission portion.

As described, the grooves are formed in the support film that supports the display panel of the display device and the crack prevention layers disposed in the grooves are formed to prevent or reduce generation and spread of cracks, which may be generated due to bending of the display device, in the support film, thereby preventing the support film 200 from being damaged due to the cracks and stably supporting the display panel 100.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of the present disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims, and equivalents thereof.

DESCRIPTION OF SOME OF THE SYMBOLS

100: display panel
200: support film
BA: bending area
210: first crack prevention portion
220: second crack prevention portion
240: third crack prevention portion
250: fourth crack prevention portion
21, 21a, 21b, 22a, 22b, 22c, 23a, 23b, 23c, 25: groove
210a, 210b, 220a, 220b, 220c, 230a, 230b, 230c: crack prevention layer

What is claimed is:

1. A support film for supporting a display panel, comprising:
a bending area having a first edge, a second edge parallel to the first edge, a third edge, and a fourth edge parallel to the third edge, and unbent areas disposed at sides of the third edge and the fourth edge,
a first groove disposed in the bending area,
a first crack prevention layer disposed in the first groove,
a second groove disposed in the bending area, and
a second crack prevention layer disposed in the second groove,
a third groove disposed in the bending area,
a third crack prevention layer disposed in the third groove,
wherein the first crack prevention layer is disposed along the first edge of the support film and the third crack prevention layer is disposed along the second edge of the support film,
wherein the second crack prevention layer is separated from the first crack prevention layer, disposed adjacent to the first crack prevention layer, and extends in parallel with the first groove,
wherein the first crack prevention layer and the third crack prevention layer are disposed in an end portion of the bending area, and
wherein a width of the bending area is a same as a width of the first crack prevention layer, a width of the third first crack prevention layer, and a width of the second crack prevention layer.

2. The support film of claim 1, wherein the support film further comprises a fourth groove that is concave and disposed at a central portion of the bending area, and a fourth crack prevention layer that is disposed in the second groove.

3. The support film of claim 2, wherein the support film further comprises a fifth groove that surrounds the fourth groove, and a fifth crack prevention layer that is disposed in the fourth groove.

4. The support film of claim 3, wherein the support film further comprises a sixth groove that is coupled with the fourth groove and formed in the shape of a closed curved line, and a sixth crack prevention layer that is disposed in the sixth groove.

5. A display device comprising:
a display panel that includes a substrate and an emission layer; and
a support film that overlaps the display panel,
wherein the display panel and the support film comprise a bending area having a first edge, a second edge parallel to the first edge, a third edge, and a fourth edge parallel to the third edge, and unbent areas disposed at sides of the third edge and the fourth edge,
wherein the support film comprises a first groove disposed in the bending area and a first crack prevention layer disposed in the first groove, a second groove disposed in the bending area and a second crack prevention layer disposed in the second groove, and a third groove disposed in the bending area and a third crack prevention layer disposed in the third groove,
wherein the first crack prevention layer is disposed along the first edge of the support film and the third crack prevention layer is disposed along the second edge of the support film,
wherein the second crack prevention layer is separated from the first crack prevention layer, disposed adjacent to the first crack prevention layer, and extends in parallel with the first groove,
wherein the first crack prevention layer and the third crack prevention layer are disposed in an end portion of the bending area, and wherein a width of the bending area is the same as a width of the first crack prevention layer, a width of the third first crack prevention layer, and a width of the second crack prevention layer.

6. The display device of claim 5, wherein the support film further comprises a fourth groove that is concave and disposed at a central portion of the bending area, and a fourth crack prevention layer that is disposed in the fourth groove.

7. The display device of claim 6, wherein the support film further comprises a fifth groove that surrounds the fourth groove, and a fifth crack prevention layer that is disposed in the fifth groove.

8. The display device of claim 7, wherein the support film further comprises a sixth groove that is coupled with the fourth groove and formed in the shape of a closed curved line, and a sixth crack prevention layer that is disposed in the sixth groove.

\* \* \* \* \*